(12) United States Patent
Lin et al.

(10) Patent No.: US 10,438,931 B2
(45) Date of Patent: Oct. 8, 2019

(54) PACKAGE STRUCTURE AND MANUFACTURING METHOD THEREOF

(71) Applicant: Powertech Technology Inc., Hsinchu County (TW)

(72) Inventors: Han-Wen Lin, Hsinchu County (TW); Hung-Hsin Hsu, Hsinchu County (TW); Shang-Yu Chang Chien, Hsinchu County (TW); Nan-Chun Lin, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 15/871,117

(22) Filed: Jan. 15, 2018

(65) Prior Publication Data

US 2018/0204822 A1 Jul. 19, 2018

Related U.S. Application Data

(60) Provisional application No. 62/446,539, filed on Jan. 16, 2017.

(51) Int. Cl.
*H01L 25/065* (2006.01)
*H01L 23/538* (2006.01)
(Continued)

(52) U.S. Cl.
CPC ........ *H01L 25/0657* (2013.01); *H01L 21/486* (2013.01); *H01L 21/561* (2013.01);
(Continued)

(58) Field of Classification Search
CPC ............... H01L 21/486; H01L 23/3135; H01L 23/5384; H01L 23/5386; H01L 23/5389;
(Continued)

(56) References Cited

U.S. PATENT DOCUMENTS 8,552,556 B1   10/2013   Kim et al.
9,911,696 B2 *  3/2018   Boon .................. H01L 23/5283
(Continued)

FOREIGN PATENT DOCUMENTS

CN   103681613   3/2014
CN   103730434   4/2014
(Continued)

OTHER PUBLICATIONS

"Office Action of Taiwan Counterpart Application", dated Jun. 25, 2018, p. 1-p. 6.
(Continued)

*Primary Examiner* — Allan R Wilson
(74) *Attorney, Agent, or Firm* — JCIPRNET

(57) ABSTRACT

A package structure includes a first redistribution layer, a second redistribution layer, a die, a plurality of conductive pillars and a die-stacked structure. The first redistribution layer has a first surface and a second surface opposite to the first surface. The second redistribution layer is disposed above the first surface. The die is disposed between the first redistribution layer and the second redistribution layer and has an active surface and a rear surface opposite to the active surface. The active surface is adhered to the first surface, and the die is electrically connected to the first redistribution layer. The conductive pillars are disposed and electrically connected between the first redistribution layer and the second redistribution layer. The die-stacked structure is bonded on the second redistribution layer.

13 Claims, 14 Drawing Sheets

(51) Int. Cl.
　　*H01L 23/31*　　(2006.01)
　　*H01L 23/00*　　(2006.01)
　　*H01L 21/683*　　(2006.01)
　　*H01L 21/48*　　(2006.01)
　　*H01L 21/56*　　(2006.01)
　　*H01L 25/00*　　(2006.01)
　　*H01L 21/78*　　(2006.01)

(52) U.S. Cl.
　　CPC ...... *H01L 21/6835* (2013.01); *H01L 23/3135* (2013.01); *H01L 23/5384* (2013.01); *H01L 23/5386* (2013.01); *H01L 23/5389* (2013.01); *H01L 24/16* (2013.01); *H01L 24/19* (2013.01); *H01L 24/25* (2013.01); *H01L 24/32* (2013.01); *H01L 24/48* (2013.01); *H01L 24/73* (2013.01); *H01L 24/83* (2013.01); *H01L 24/85* (2013.01); *H01L 24/92* (2013.01); *H01L 24/96* (2013.01); *H01L 25/50* (2013.01); *H01L 21/568* (2013.01); *H01L 21/78* (2013.01); *H01L 23/3128* (2013.01); *H01L 24/33* (2013.01); *H01L 2221/68331* (2013.01); *H01L 2221/68345* (2013.01); *H01L 2221/68359* (2013.01); *H01L 2224/13147* (2013.01); *H01L 2224/16225* (2013.01); *H01L 2224/18* (2013.01); *H01L 2224/24145* (2013.01); *H01L 2224/2518* (2013.01); *H01L 2224/25171* (2013.01); *H01L 2224/32145* (2013.01); *H01L 2224/32225* (2013.01); *H01L 2224/33181* (2013.01); *H01L 2224/48091* (2013.01); *H01L 2224/48106* (2013.01); *H01L 2224/48227* (2013.01); *H01L 2224/73209* (2013.01); *H01L 2224/73215* (2013.01); *H01L 2224/73217* (2013.01); *H01L 2224/73259* (2013.01); *H01L 2224/73265* (2013.01); *H01L 2225/0651* (2013.01); *H01L 2225/06548* (2013.01); *H01L 2225/06562* (2013.01); *H01L 2225/06586* (2013.01)

(58) Field of Classification Search
　　CPC ......... H01L 24/16; H01L 24/25; H01L 24/32; H01L 24/48; H01L 24/83; H01L 24/85; H01L 24/92; H01L 24/96; H01L 25/0657
　　See application file for complete search history.

(56) References Cited

U.S. PATENT DOCUMENTS

| | | | | |
|---|---|---|---|---|
| 2009/0309206 | A1* | 12/2009 | Kim | H01L 24/91 257/686 |
| 2012/0119373 | A1* | 5/2012 | Hunt | H01L 21/565 257/774 |
| 2013/0270230 | A1* | 10/2013 | Cheung | H01L 24/75 219/121.6 |
| 2013/0270682 | A1* | 10/2013 | Hu | H01L 23/5389 257/666 |
| 2016/0013147 | A1* | 1/2016 | Cheng | H01L 24/17 257/774 |
| 2016/0099231 | A1* | 4/2016 | Yang | H01L 23/3171 257/693 |
| 2017/0053898 | A1* | 2/2017 | Yeh | H01L 25/0657 |
| 2017/0084589 | A1* | 3/2017 | Kuo | H01L 25/105 |
| 2018/0012863 | A1* | 1/2018 | Yu | G06K 9/00006 |
| 2018/0026022 | A1* | 1/2018 | Lee | H01L 21/561 257/659 |
| 2018/0076179 | A1* | 3/2018 | Hsu | H01L 21/56 |

FOREIGN PATENT DOCUMENTS

| | | |
|---|---|---|
| CN | 105261611 | 1/2016 |
| CN | 105280575 | 1/2016 |
| CN | 106129020 | 11/2016 |
| CN | 106169459 | 11/2016 |
| TW | 200828564 | 7/2008 |
| TW | 201248747 | 12/2012 |
| TW | 201312663 | 3/2013 |
| TW | I531044 | 4/2016 |
| TW | 201622021 | 6/2016 |
| TW | 201642358 | 12/2016 |
| TW | 201642368 | 12/2016 |
| TW | 201643999 | 12/2016 |
| TW | I569390 | 2/2017 |

OTHER PUBLICATIONS

"Office Action of China Counterpart Application", dated Jun. 4, 2019, pp. 1-12.

* cited by examiner

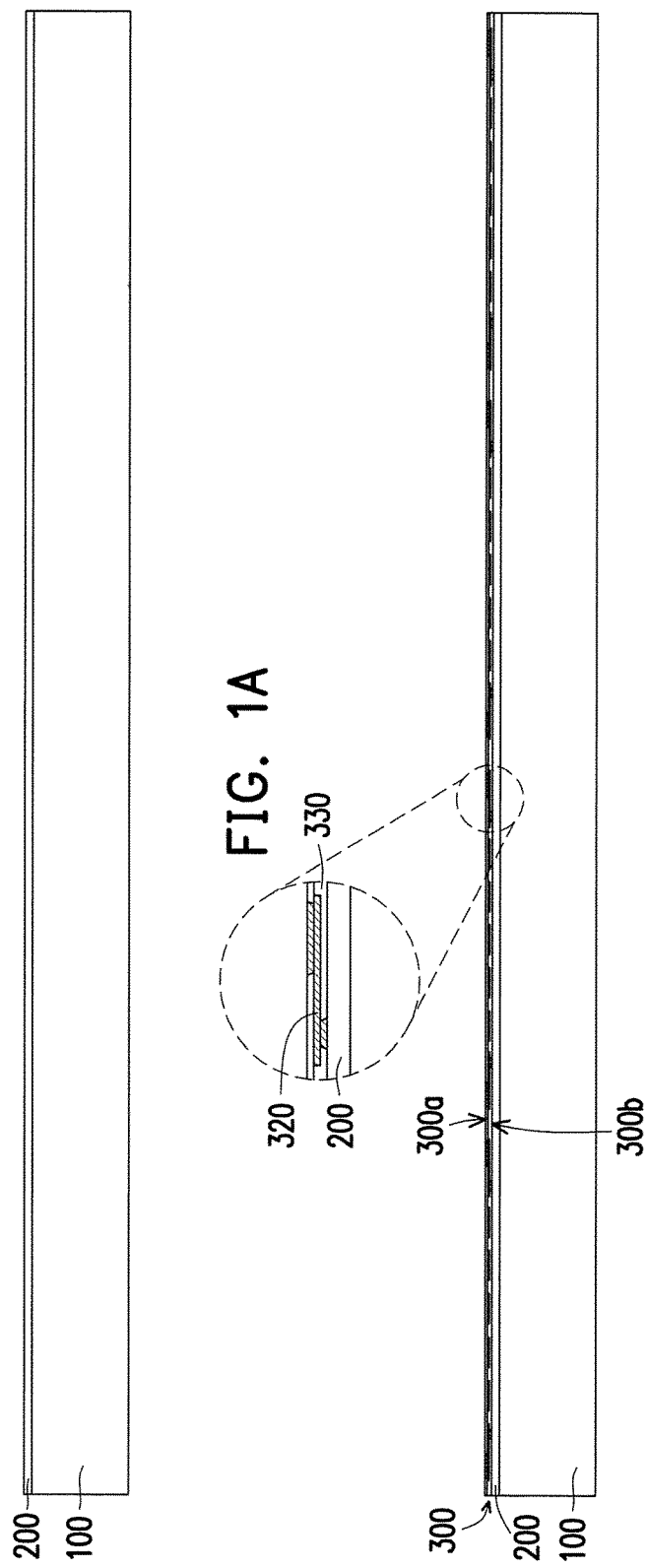

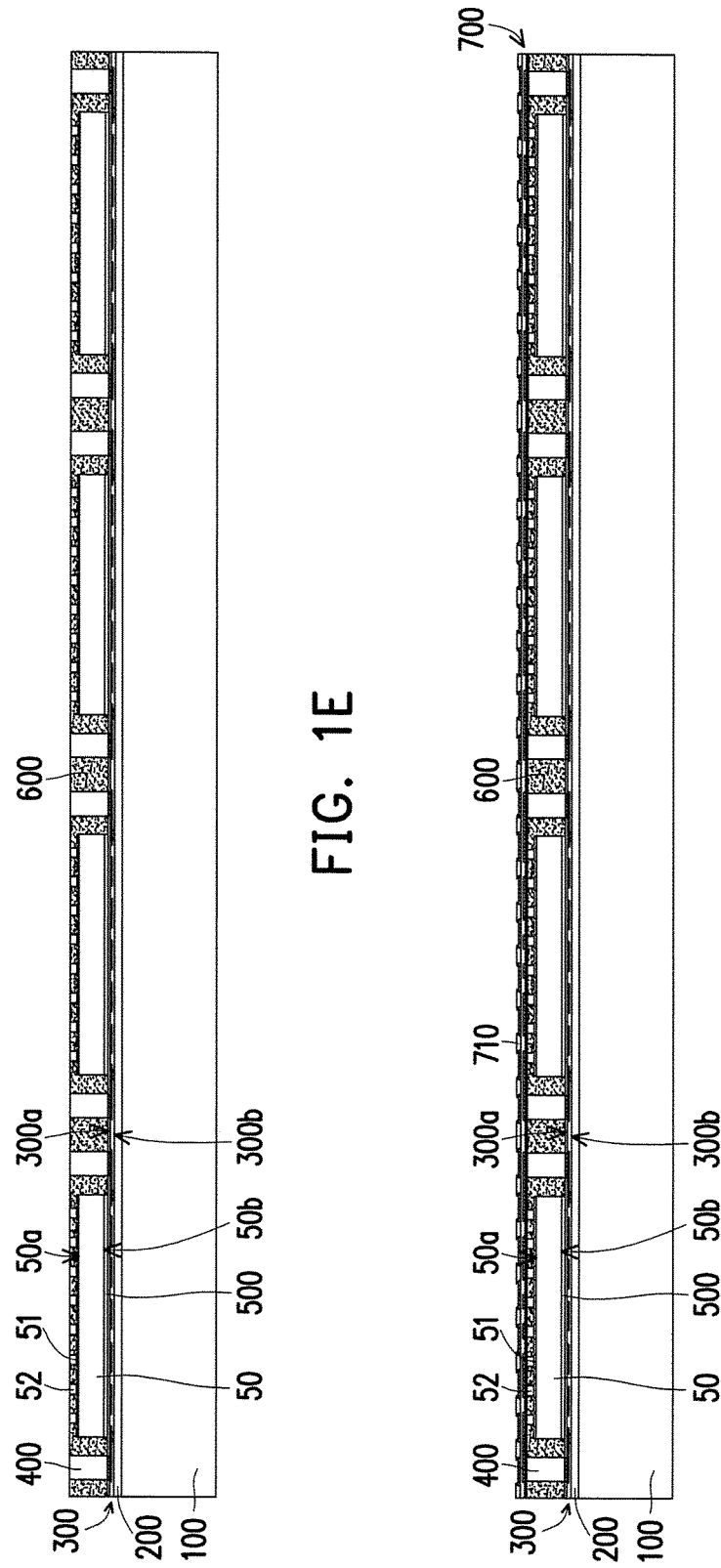

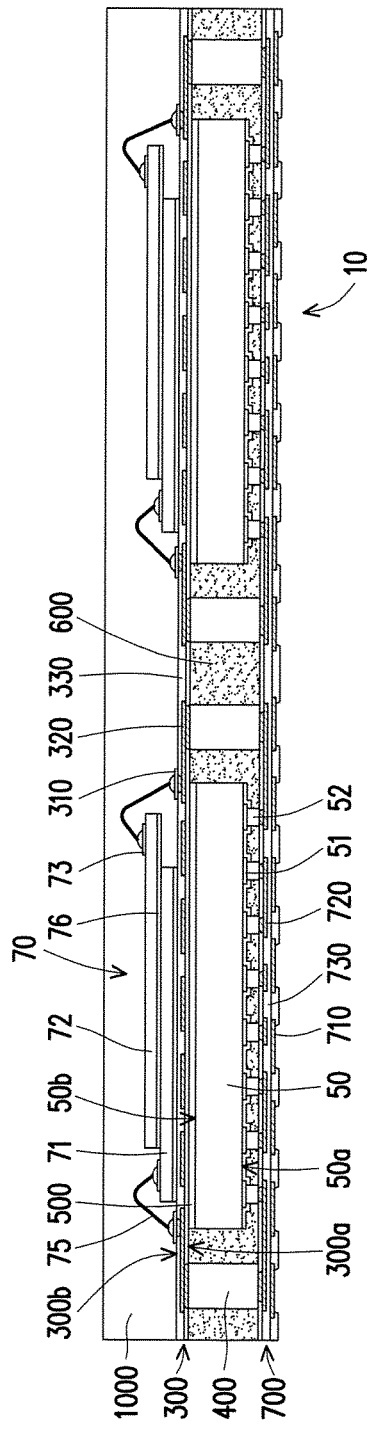
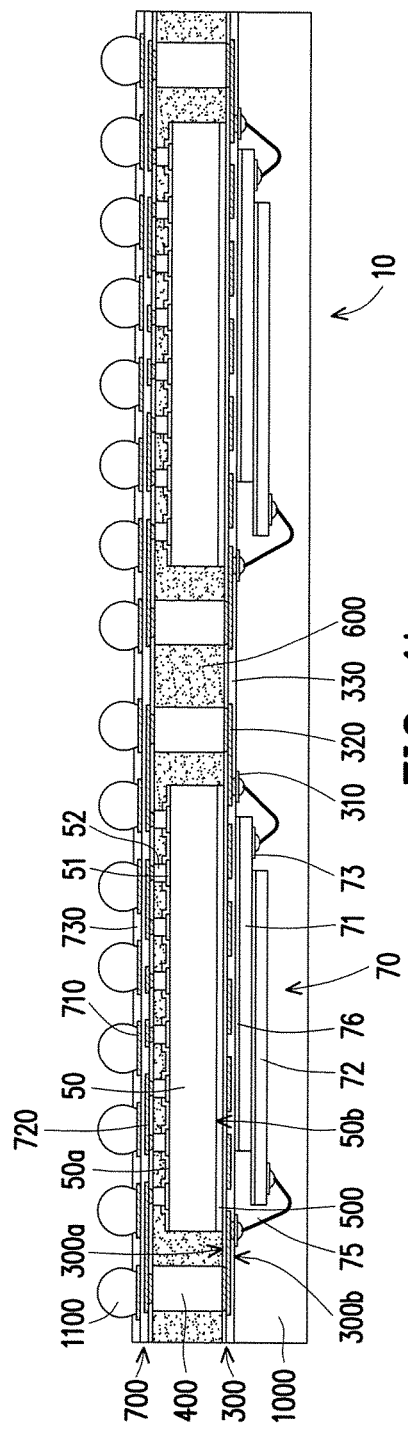
FIG. 1K
FIG. 1L

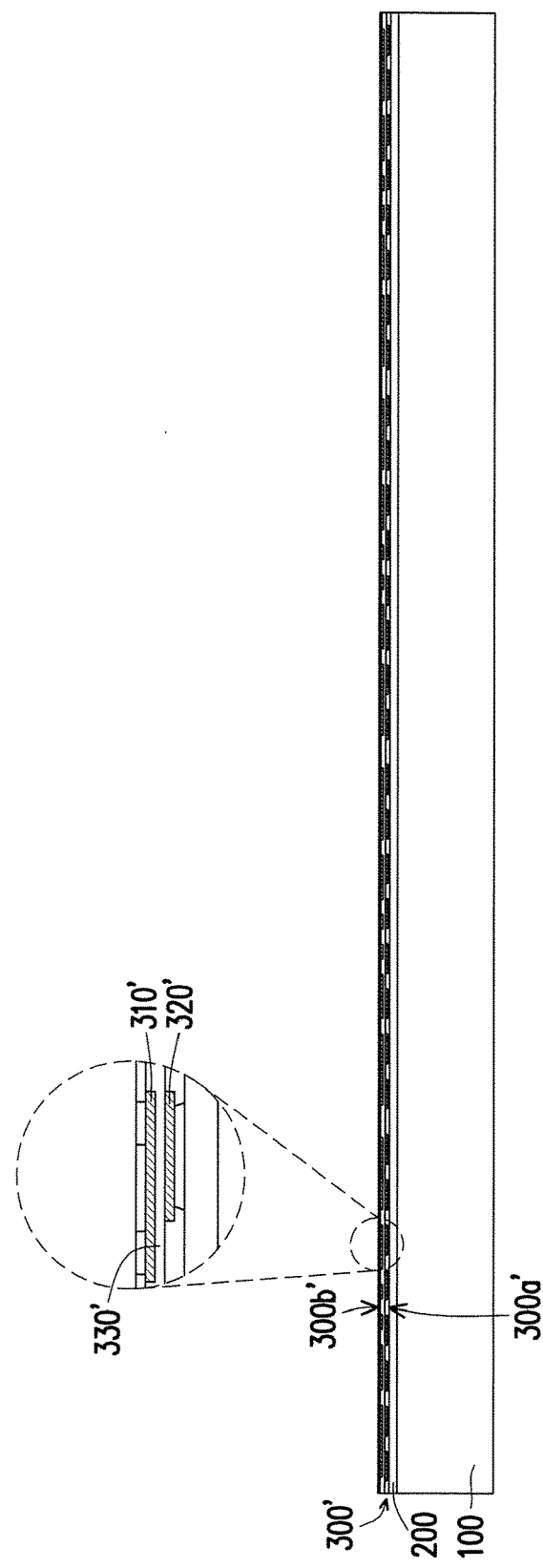

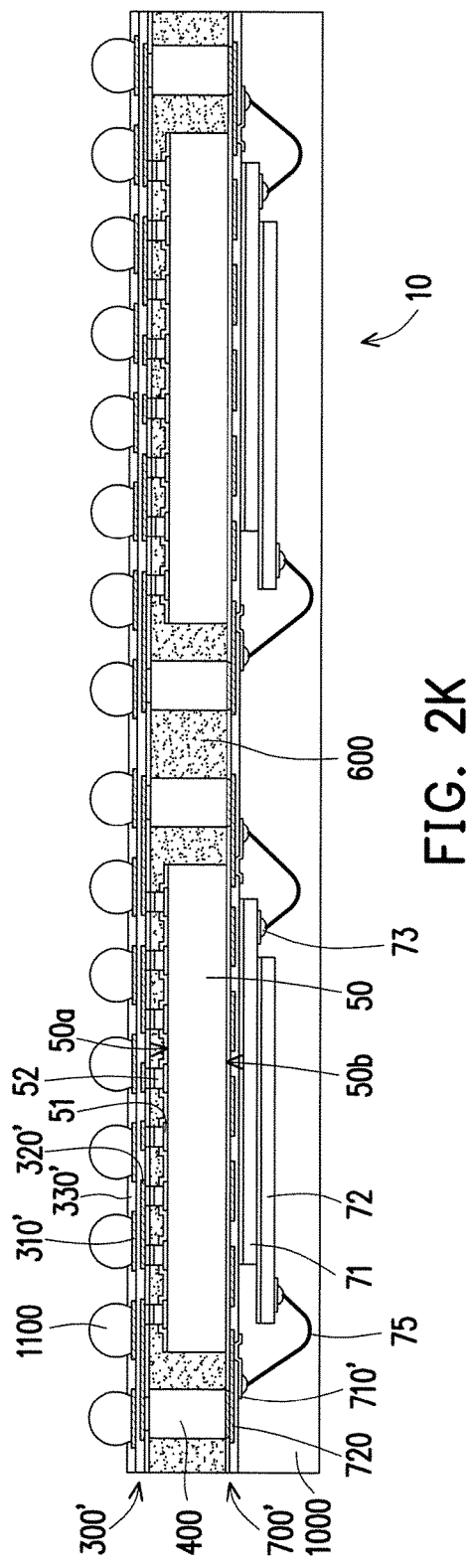
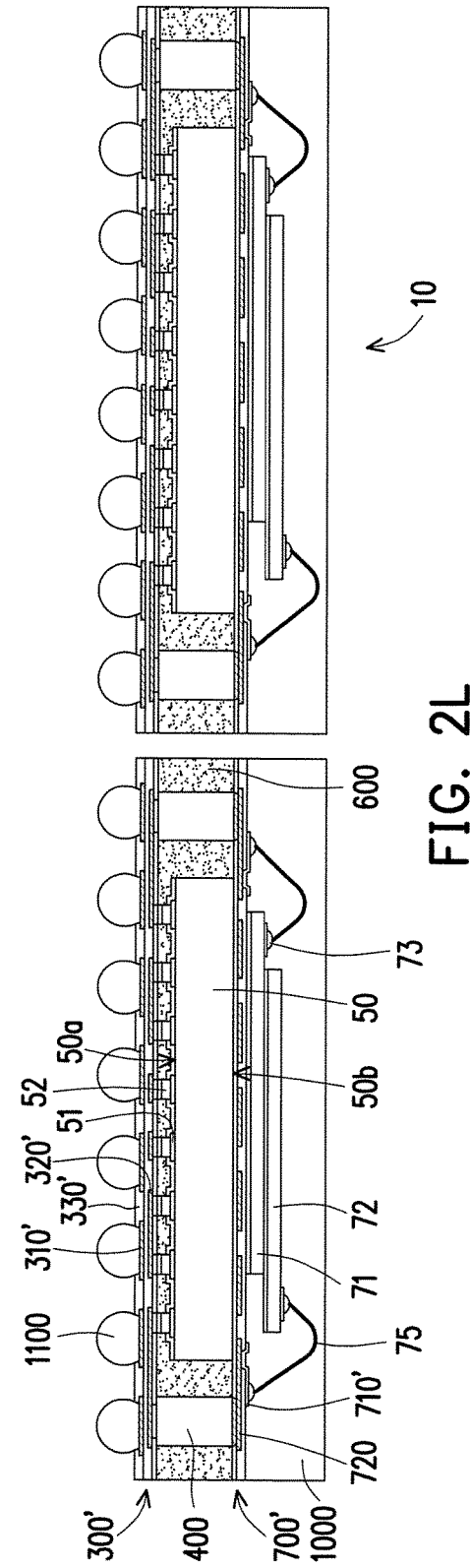

PACKAGE STRUCTURE AND MANUFACTURING METHOD THEREOF

CROSS REFERENCE TO RELATED APPLICATION

This application claims the priority benefit of U.S. provisional application Ser. No. 62/446,539, filed on Jan. 16, 2017. The entirety of the above-mentioned patent application is hereby incorporated by reference herein and made a part of specification.

BACKGROUND OF THE INVENTION

1. Field of the Invention

The present invention generally relates to a package structure, in particular, to a package structure having a die-stacked structure.

2. Description of Related Art

With advancement of the technology, the electronic product has been designed to achieve being light, slim, short, and small, so as to develop products that are smaller in volume, lighter in weight, higher in integration, and more competitive in the market. As the products gradually shrinkage in volume, the package structure of the chip also has to be further reduced in its overall dimension, such as thickness. As such, how to miniature the package structure, so as to meet a design trend of electronic products toward small, thin and light-weighted, has become a challenge to those researchers in the field.

SUMMARY OF THE INVENTION

Accordingly, the present invention provides a semiconductor package structure and a manufacturing method thereof, which effectively reduce the overall volume and the trace length of the package structure.

The present invention provides a package structure including a first redistribution layer, a second redistribution layer, a die, a plurality of conductive pillars and a die-stacked structure. The first redistribution layer has a first surface and a second surface opposite to the first surface. The second redistribution layer is disposed above the first surface. The die is disposed between the first redistribution layer and the second redistribution layer and has an active surface and a rear surface opposite to the active surface. The active surface is adhered to the first surface, and the die is electrically connected to the first redistribution layer. The conductive pillars are disposed and electrically connected between the first redistribution layer and the second redistribution layer. The die-stacked structure is bonded on the second redistribution layer.

The present invention provides a manufacturing method of a package structure. The method includes at least the following steps. A carrier substrate is provided. A first redistribution layer is formed on the carrier substrate. The first redistribution layer has a first surface and a second surface opposite to the first surface. The carrier substrate is adhered on the second surface. A plurality of conductive pillars is formed on the first surface. A plurality of dies is adhered on the first surface and among the conductive pillars. Each die has an active surface, a rear surface opposite to the active surface. The dies and the conductive pillars are encapsulated by using the insulation encapsulation. A second redistribution layer is formed over the dies and the insulation encapsulation. The dies are bonded to the second redistribution layer by the active surface. The carrier substrate is separated from the first redistribution layer. A die-stacked structure is bonded on the second redistribution layer.

The present invention provides a manufacturing method of a package structure. The method includes at least following steps. A first carrier substrate is provided. A first redistribution layer is formed on the first carrier substrate. The first redistribution layer has a first surface and a second surface opposite to the first surface. The first surface faces the first redistribution layer. The first redistribution layer is transferred from the first carrier substrate to the second carrier substrate. The second carrier substrate is adhered to the second surface of the first redistribution layer. A plurality of conductive pillars is formed on the first surface. A plurality of dies is disposed on the first surface and among the conductive pillars. Each die has an active surface and a rear surface opposite to the active surface. The active surfaces of the dies face the first surface of the first redistribution layer. The dies are electrically connected to the first redistribution layer. The die and the conductive pillars are encapsulated by using an insulation encapsulation. A second redistribution layer is formed over the dies, the conductive pillars and the insulation encapsulation. The second redistribution layer is adhered to the rear surfaces of the dies. The second carrier substrate is separated from the first redistribution layer. A die-stacked structure is bonded on the second redistribution layer.

Based on the above, a die-stacked structure is directly disposed on and in contact with the second redistribution layer. Moreover, the die-stacked structure may be electrically connected to the die disposed between the first redistribution layer and the second redistribution layer through the first and second redistribution layers and the conductive pillars disposed therebetween. Accordingly, there is no bumping structures, gaps, or other substrates further disposed between the die-stacked structure and the second redistribution layer. As such, the overall thickness of the package structure may be reduced. In addition, the simplified package structure may reduce the required time and material consumption in manufacturing process, and thereby the manufacturing cost of the package structure is further decreased.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1A to FIG. 1M are cross-sectional views illustrating a manufacturing method of the package structure according to an embodiment of the present invention.

FIG. 2A to FIG. 2L are cross-sectional views illustrating a manufacturing method of the package structure according to another embodiment of the present invention.

DESCRIPTION OF THE EMBODIMENTS

Figure 1C:
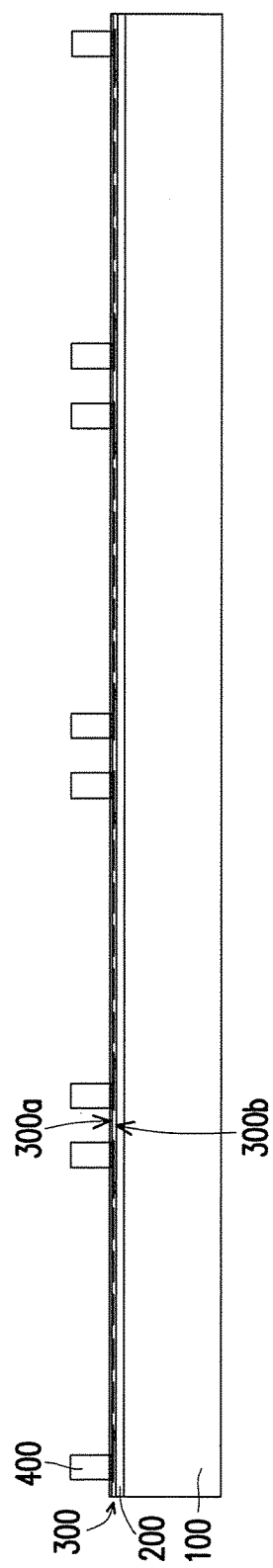

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1M are cross-sectional views illustrating a manufacturing method of the package structure according to an embodiment of the present invention. Referring to FIG. 1A, a carrier substrate 100 is provided. The carrier substrate 100 may be made of silicon, glass, resin, or other suitable materials. Other suitable substrate materials may be used as the carrier substrate 100 as long as the material is able to withstand the subsequent process and carry the package structure formed thereon. A adhesive layer 200 can be formed over the carrier substrate 100 to enhance the temporary adhesion between the carrier substrate 100 and the elements subsequently formed thereon. The adhesive layer may be a light to heat conversion (LTHC) adhesive layer or other suitable adhesive layers.

Referring to FIG. 1B, a first redistribution layer 300 is formed over the carrier substrate 100 and the adhesive layer 200. The first redistribution layer 300 may include a plurality of trace layers 320 for electrically connecting the external circuits or the elements. In addition, as shown in FIG. 1B, the first redistribution layer 300 has a first surface 300a and a second surface 300b opposite to the first surface 300a.

Referring to FIG. 1C, a plurality of conductive pillars 400 are formed on the first surface 300a of the first redistribution layer 300. The conductive pillars 400 are electrically connected to the first redistribution layer 300. The conductive pillars 400 may be made of copper, aluminium, tin, gold, silver, or a combination thereof.

Figure 1D:
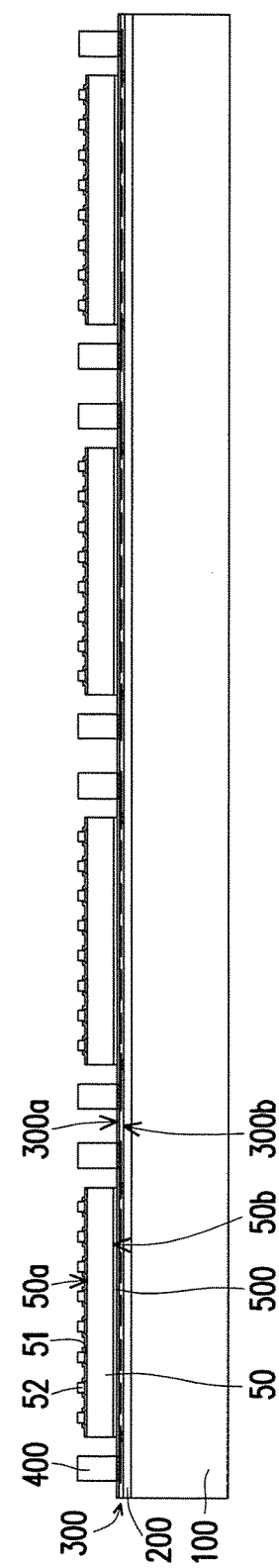

Referring to FIG. 1D, a plurality of dies 50 are formed on the first surface 300a. The dies 50 may include an application processor (AP), a system on chip (SoC), a central processing unit (CPU), or other semiconductor chip. An adhesive layer 500 may be disposed between the dies and the first surface 300a of the first redistribution layer 300 for adhering the dies 50 to the first surface 300a of the redistribution layer 300. In the present embodiment, the adhesive layer 500 may be made of epoxy, a silver paste, a die attach film (DAF), or other suitable adhesive material. Each die 50 may have an active surface 50a and a rear surface 50b opposite to the active surface 50a. As illustrated, the first redistribution layer 300 is adhered to the rear surface 50b of the die 50 through the adhesive layer 500. The adhesive layer 500 may be formed by methods such as spin coating, inkjet printing, or other suitable manufacturing methods for providing a structural support to eliminate the need for mechanical clamping between the die 50 and the first redistribution layer 300. As illustrated in FIG. 1D, a plurality bumps 52 and pads 51 formed on the active surface 50a. In some embodiment not illustrated, the adhesive layer 500 may be formed on a wafer before the wafer is singulated into a plurality of the dies 50.

Referring to FIG. 1E, an insulation encapsulation 600 may be utilized to encapsulate the dies 50 and the conductive pillars 400. The insulation encapsulation 600 may include molding compounds formed by a molding process. The insulation encapsulation 600 may be formed by an insulating materials such epoxy or other suitable resins. The insulation encapsulation 600 may be thinned through a thinning process to expose the conductive pillars 400 and the bumps 52 for the subsequent processes. In the present embodiment, the thinning process may be achieved by mechanical grinding, chemical-mechanical polishing (CMP), etching, or other suitable processes. The etching process for the conductive pillars 400 may include anisotropic etching or isotropic etching.

Referring to FIG. 1F, a second redistribution layer 700 is disposed over the dies 10, the conductive pillars 400, and the insulation encapsulation 600. The second redistribution layer 700 may include a plurality of dielectric layers 730, trace layers 720, and ball pads 710. As shown in FIG. 1F, the second redistribution layer 700 is electrically connected to the conductive pillars 400 and the first redistribution layer 300 through the conductive pillars 400. In addition, the die 50 is electrically connected to the second redistribution layer 700 through the bumps 52 and the pads 51. Furthermore, a plurality of ball pads 710 may be disposed on the second redistribution layer 700.

Figure 1G:
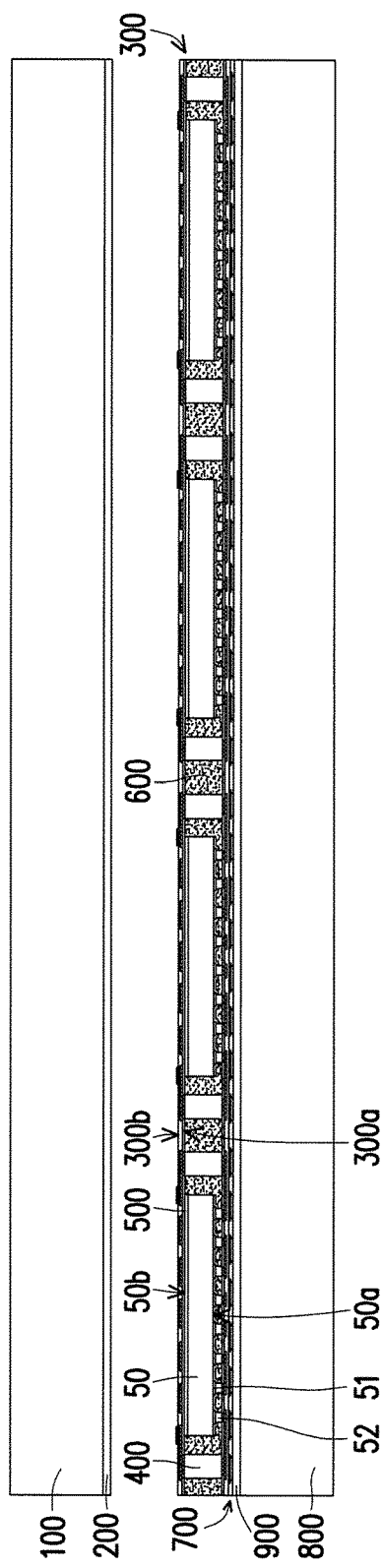

Referring to FIG. 1G, a carrier substrate 800 may be adhered to the second redistribution layer 700 through an adhesive layer 900. The adhesive layer 900 can be formed through a lamination process. In addition, the carrier substrate 100 is separated from the second surface 300b of the first redistribution layer 300 by the adhesive layer 200.

Figure 1H:
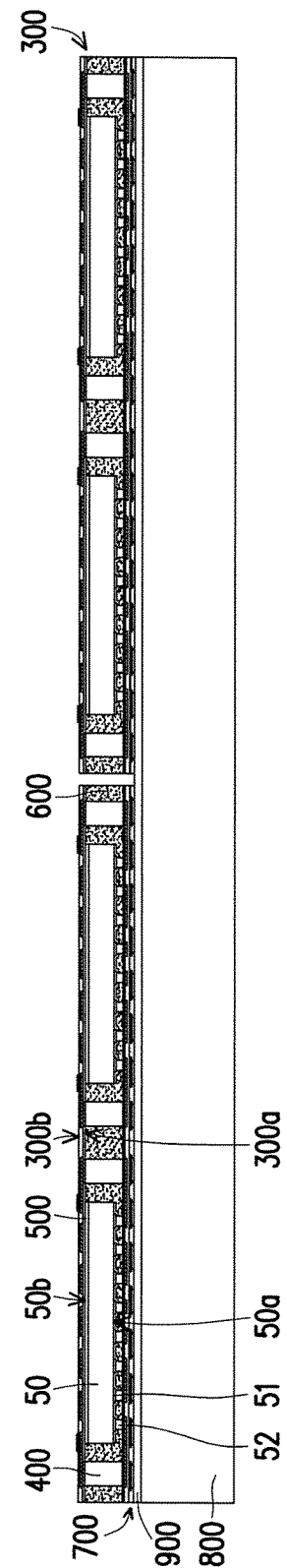

Referring to FIG. 1H, a strip sawing process may be applied to the package structure before a wire bonding process due to limitations of the dimensions of the wire bonding machine (not illustrated). In some other embodiments, the strip sawing process can be applied to the package structure after the wire bonding process. The sequential order of the strip sawing process may be adjusted depending on configurations of the processing equipment and the practical needs. The carrier substrate 800 may be debonded from the second redistribution layer 700 through the adhesive layer 900 before the strip sawing process.

Figure 1I:
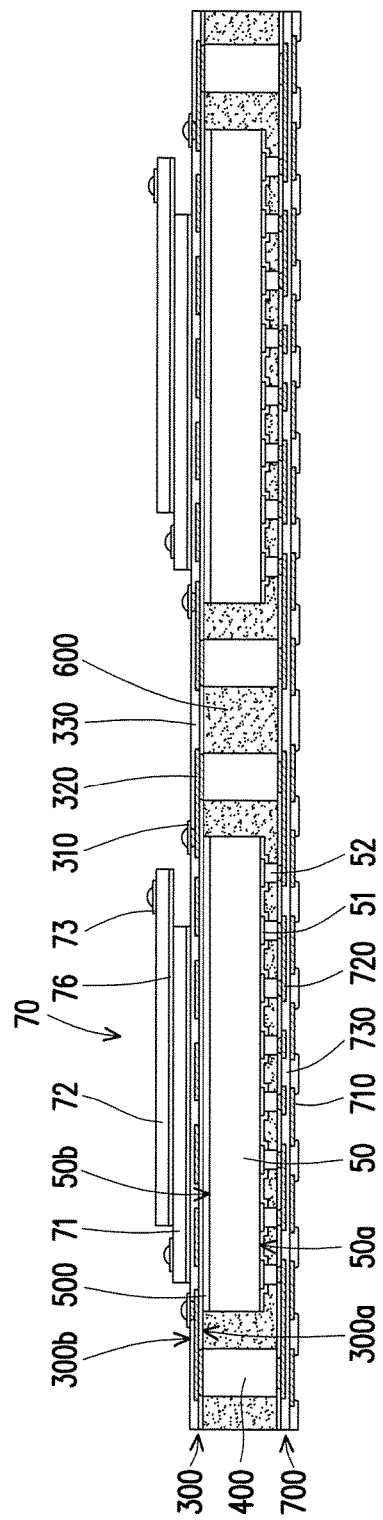
Figure 1J:
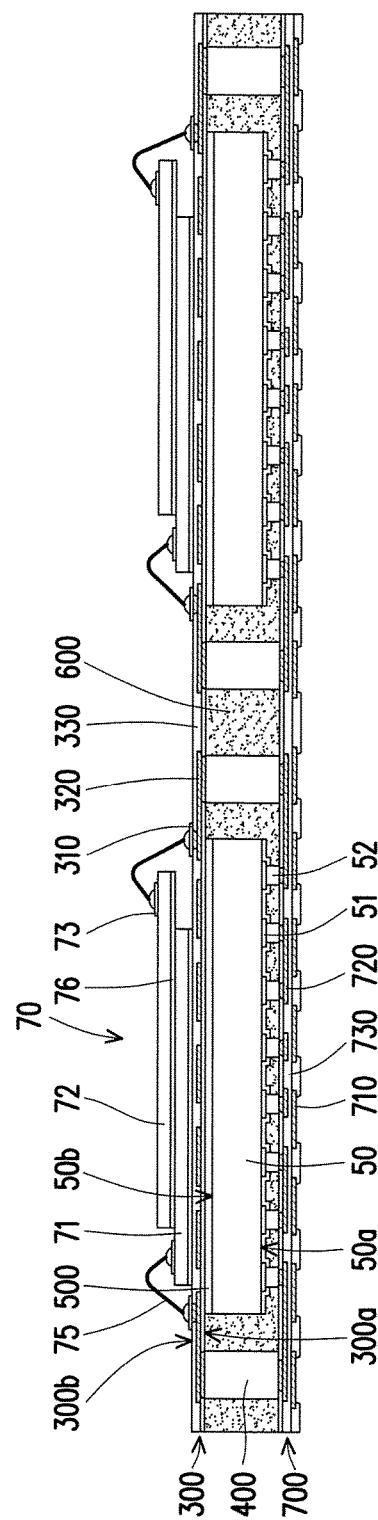

Referring to FIG. 1I and FIG. 1J, a die-stacked structure 70 may be formed on the second surface 300b of the first redistribution layer 300. In the present application, the die-stacked structure 70 includes at least a bottom semiconductor die and a top semiconductor die stacked on top of each other. For example, as shown in FIG. 1I and FIG. 1J, the die-stacked structure 70 may include a first semiconductor die 71 and a second semiconductor die 72. The first semiconductor die 71 is disposed on the second surface 300b of the first redistribution layer 300. The second semiconductor die 72 is stacked on the first semiconductor die 71. In some embodiments, a die attach film (DAF) 76 may be disposed on the bottom surface of each of the stacked dies 71, 72 to enhance their adhesion. The first redistribution die 71 and the second semiconductor die 72 are, for example, memory dies or flash dies.

As illustrated, the second semiconductor die 72 may cover a portion of the upper surface of the first semiconductor die 71 and exposes the remaining portion of the upper surface of the first semiconductor die 71 having a plurality of bonding pads 73. The upper surface of the semiconductor die 72 also has plurality of the bonding pads 73. The bonding pads 73 are, for example, aluminium pads, copper pads, or any other suitable material used for wire bonding. As illustrated in FIG. 1I, a plurality of conductive wires 75 is provided to electrically connect the bonding pads 73 of the first semiconductor die 71, the bonding pads 73 of the second semiconductor 72, and the bonding pads 310 of the first redistribution layer 300. Accordingly, the die-stacked structure 70 is electrically connected to the first redistribution layer 300 through wire bonding, and further, being electrically connected to the die 50 through the conductive pillars 400 and the second redistribution layer 700. Furthermore, in some embodiments, the adhesive layer 500 may be disposed between the die 50 and the die-stacked structure 70.

Referring to FIG. 1K, the die-stacked structure 70 disposed on the second surface 300b of the first redistribution layer 300 may be encapsulated by the insulation encapsulation 1000 and form a package structure 10 as illustrated in FIG. 1K. The lateral sides of the insulation encapsulation 1000 may be aligned with the lateral sides of the insulation encapsulation 600. That is, the die 50 and the die-stacked structure 70 may be both disposed within a single package. Accordingly, there is no need for using extra substrates or forming gaps between the die-stacked structure 70 and the die 50. The overall thickness of the package structure 10 of the die-stacked structure 70 and the die 50 may be further reduced.

Figure 1M:
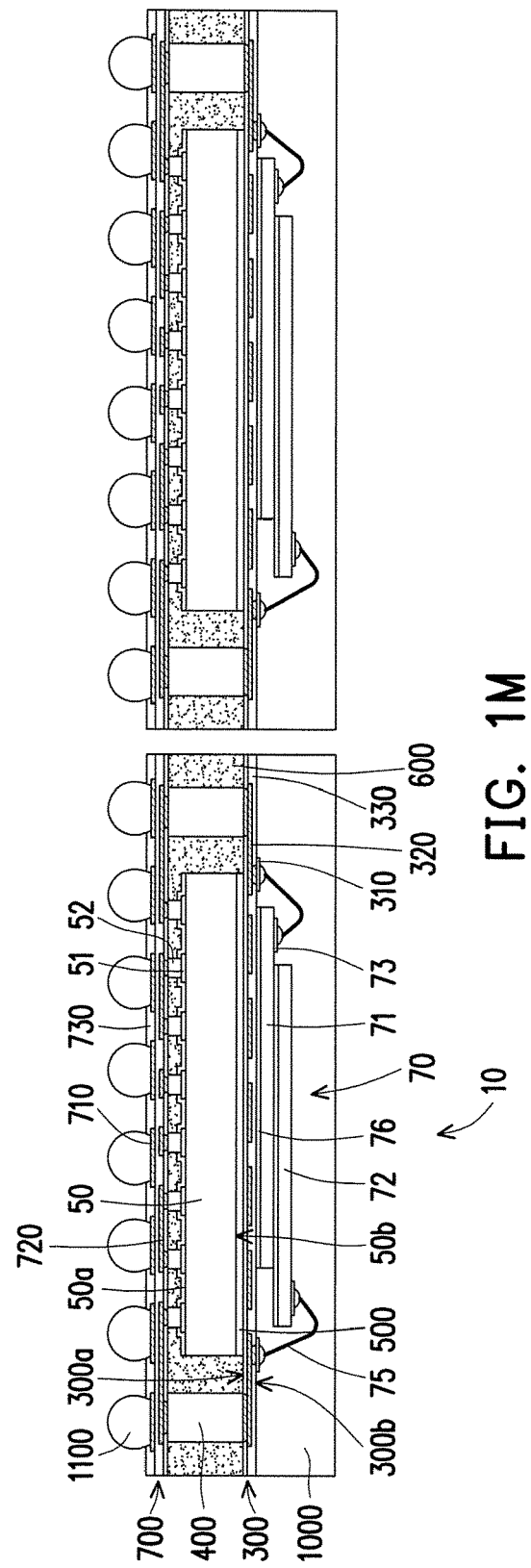

Referring to FIG. 1L, a plurality of conductive balls 1100 may be formed on the ball pads 710 by, for example, a ball placement process and a reflow process. Referring to FIG. 1M, after placing the conductive balls 110 on the ball pads 710, a singulation process is performed on the package structure 50 illustrated in FIG. 1L to render the individual package structure 50 as shown in FIG. 1M.

FIG. 2A to FIG. 2L are cross-sectional views illustrating a manufacturing method of the package structure according to another embodiment of the present invention. The embodiments shown in FIG. 2A to FIG. 2L are similar to the embodiments shown in FIG. 1A to FIG. 1M, therefore, the same reference numerals are used to refer to the same or like parts, and their detailed descriptions are omitted herein. The difference between the embodiments shown in FIG. 2A to FIG. 2L and the embodiments shown in FIG. 1A to FIG. 1M is in the disposition method of the die 50, which is processed in a flip-chip fashion.

Referring to FIG. 2A, the carrier substrate 100 is provided. Moreover, the adhesive layer 200 is formed on the carrier substrate 100. A first redistribution layer 300' is adhered on the carrier substrate 100 through the adhesive layer 200. The first redistribution layer 300' includes a first surface 300a' and a second surface 300b' opposite to the first surface 300a'. As shown in FIG. 2A, the first surface 300a' is in contact with the carrier substrate 100. The first redistribution layer 300' may include a plurality of dielectric layers 330', trace layers 320', and bonding pads 310' disposed on the second surface 300b'. The trace layers 320' are electrically connected to the bonding pads 310'. In the present embodiment, the trace layers 320' may be made of copper, nickel, or a combination thereof.

Figure 2B:
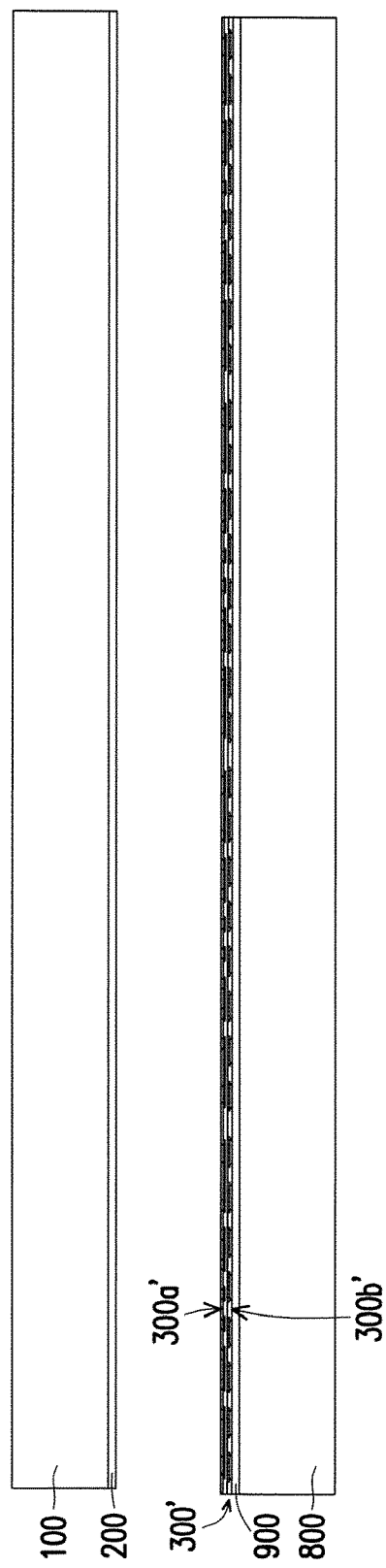

Referring to FIG. 2B, the first redistribution layer 300' may be transferred from the carrier substrate 100 to the carrier substrate 800. The carrier substrate 800 is adhered to the second surface 300b' of the first redistribution layer 300 through the adhesive layer 900.

Figure 2C:
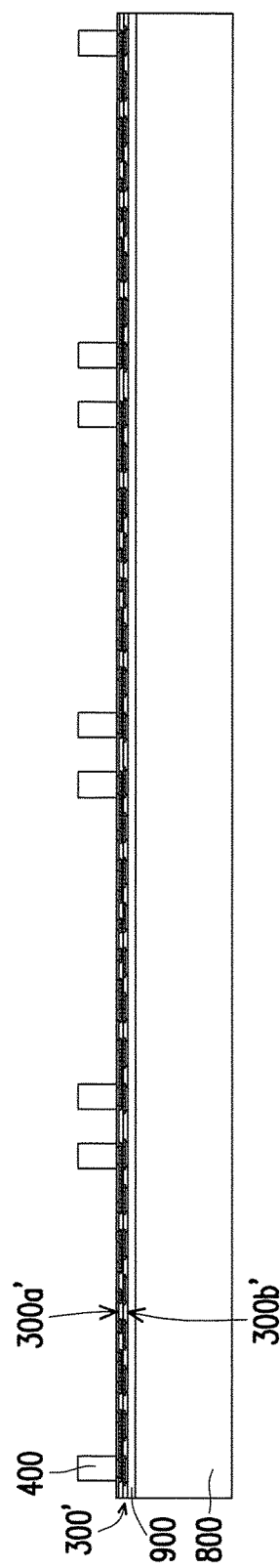
Figure 2D:
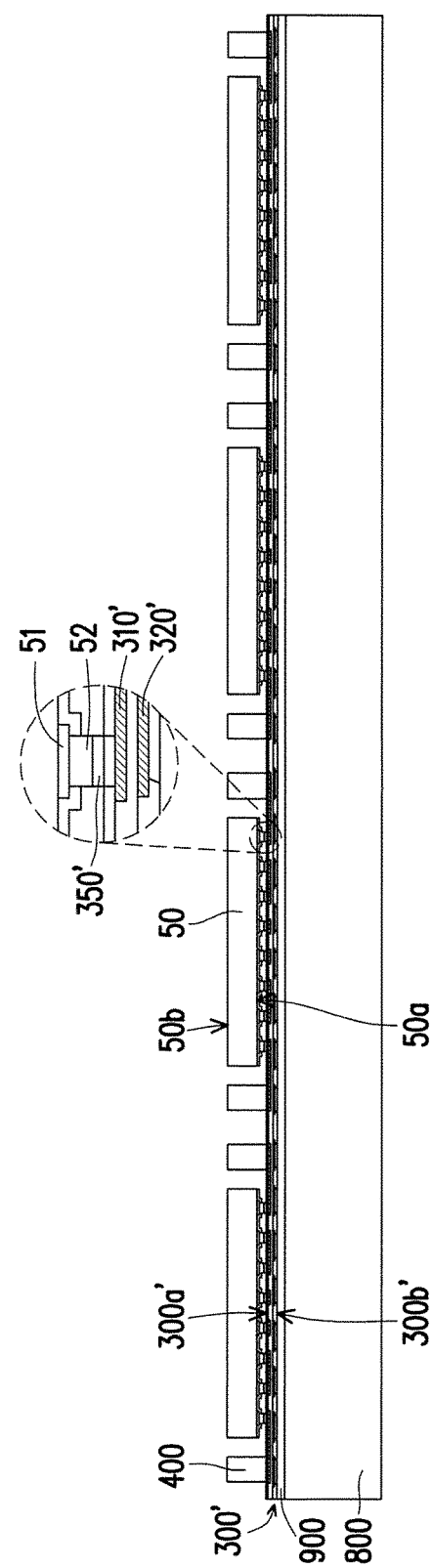

Referring to FIG. 2C, the conductive pillars 400 may be formed on the first surface 300a' and electrically connected to the first redistribution layer 300'. Referring to FIG. 2D, the dies 50 are respectively disposed on the first surface 300a' through a flip-chip bonding process. In some embodiments, the dies 50 are electrically connected to the first redistribution layer 300' through copper pillars by flip-chip bonding. The die 50 has the active surface 50a and the rear surface 50b opposite to the active surface 50a. As shown in FIG. 2D, the active surface 50a faces the first surface 300a' of the first redistribution layer 300'.

As illustrated in FIG. 2D, a plurality of the conductive terminals 350' may be formed on the first surface 300a' of the first redistribution layer 300' and electrically connected to the above-mentioned trace layers 320' and the bonding pads 310. The conductive terminals 350' may be a plurality of under-ball metallurgy (UBM) patterns for ball mount or connection pads. Moreover, the bumps 52 and the pads 51 may be formed on active surface 50a of the die 50 and bonded to the conductive terminals 350'.

Figure 2E:
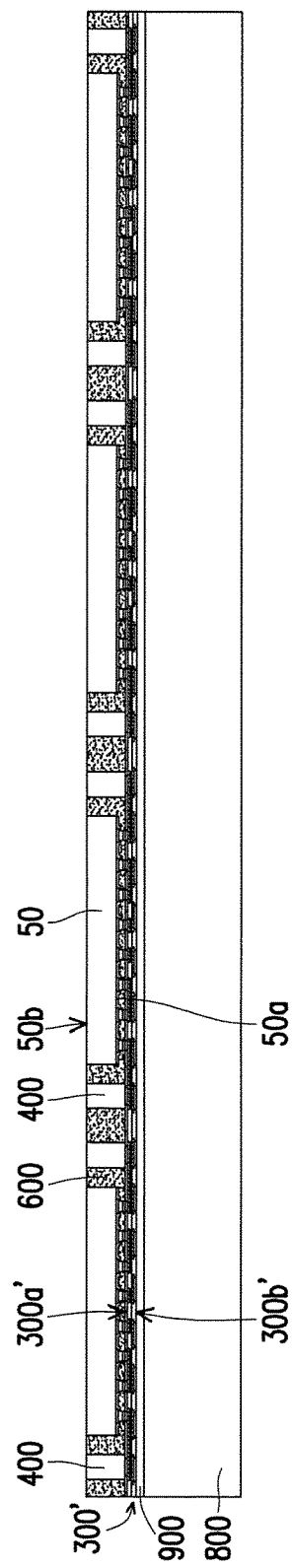

Referring to FIG. 2E, the insulation encapsulation 600 may be utilized to encapsulate the dies 50 and the conductive pillars 400. The insulation encapsulation 600 may be thinned by the thinning process to expose the conductive pillars 400 and the rear surface 50b of the die 50. In another embodiment not illustrated, the rear surface 50b of the die 50 may be still covered by the insulation encapsulation 600 or a dielectric layer after the thinning process. The thinning process may be achieved by, for example, mechanical grinding, chemical-mechanical polishing (CMP), etching, or other suitable materials. The etching process for the conductive pillars 400 may include anisotropic etching or isotropic etching.

Figure 2F:
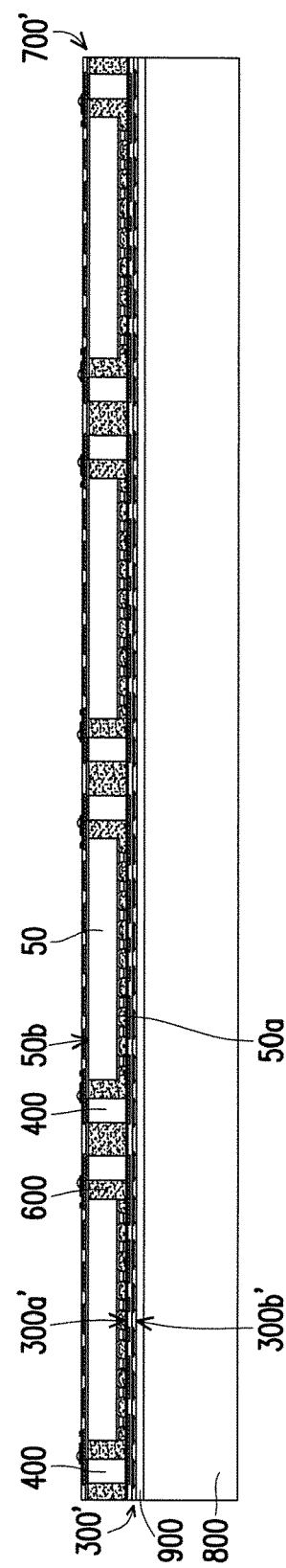
Figure 2G:
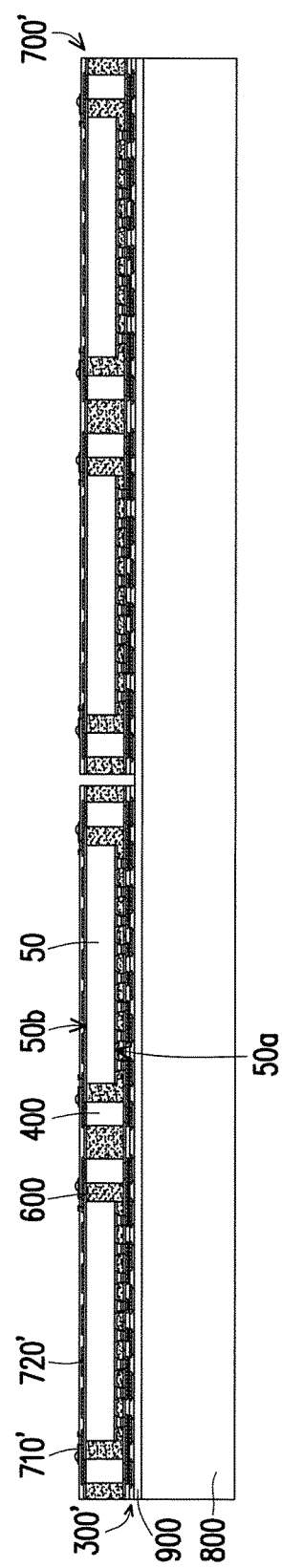

Referring to FIG. 2F, a second redistribution layer 700' is disposed over the die 50, the conductive pillar 400, and the insulation encapsulation 600. Referring to 2G, a strip sawing process may be performed on the package structure due to the dimensional limitations of the wire bonding machine (not illustrated). The second redistribution layer 700' may be directly in contact with the rear surface 50b of the die 50. As such, there are no extra adhesive layers or dielectric layers disposed between the rear surface 50b of the die 50 and the second redistribution layer 700. Therefore, the thickness of the overall package structure may be further reduced.

Figure 2H:
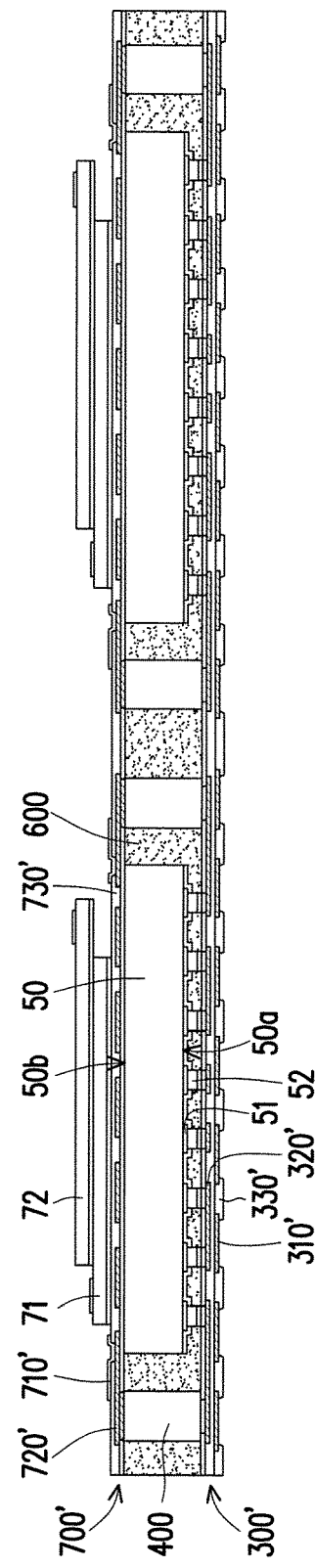

Referring to FIG. 2H, a die-stacked structure 70 may be disposed on the second redistribution layer 700'. As shown in the FIG. 2H, the second redistribution layer 700' may include a plurality of trace layers 720' and dielectric layers 730' alternately formed and stacked on the upper surface of each other. In addition, the second redistribution layer 700' may further include a plurality of bonding pads 710' disposed on the surface of the second redistribution layer 700' for the subsequent wire bonding process of the die-stacked structure 70. The die-stacked structure 70 includes at least a bottom semiconductor die and a top semiconductor die stacked on the upper surface of each other. For example, as shown in 2H, the die-stacked structure 70 includes a first semiconductor die 71 and a second semiconductor die 72 stacked thereabove. In some embodiments, a die attach film (DAF) 76 may be disposed on the bottom surface of each of the stacked dies 71, 72 to enhance their adhesion.

Figure 2I:
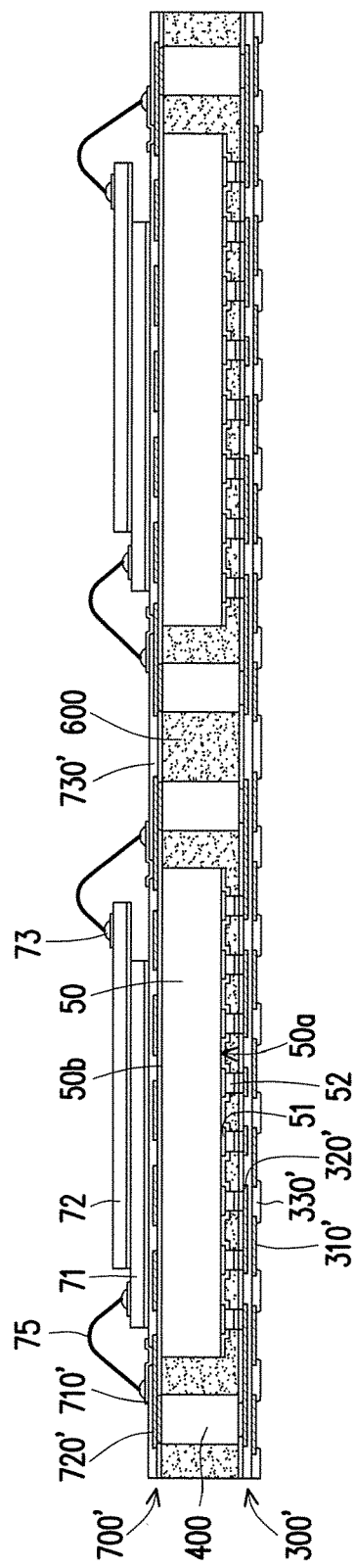

Referring to the FIG. 2I, the second semiconductor die 72 covers a portion of the upper surface of the first semiconductor die 71 and exposes the remaining portion of the upper surface having the bonding pads 73. The upper surface of the second semiconductor die also has the bonding pads 73. The bonding pads 73 are, for example, aluminium pads, copper pads, or any other suitable materials used for wire bonding. A plurality of conductive wires 75 is provided to electrically connect the bonding pads 73 of the first semiconductor die 71 and the bonding pads 73 of the second semiconductor 72 to the bonding pads 710' of the second redistribution layer 700'. Accordingly, the die-structure 70 is wire bonded to the second redistribution layer 700', the conductive pillars 400, and electrically connected to the die 50.

Figure 2J:
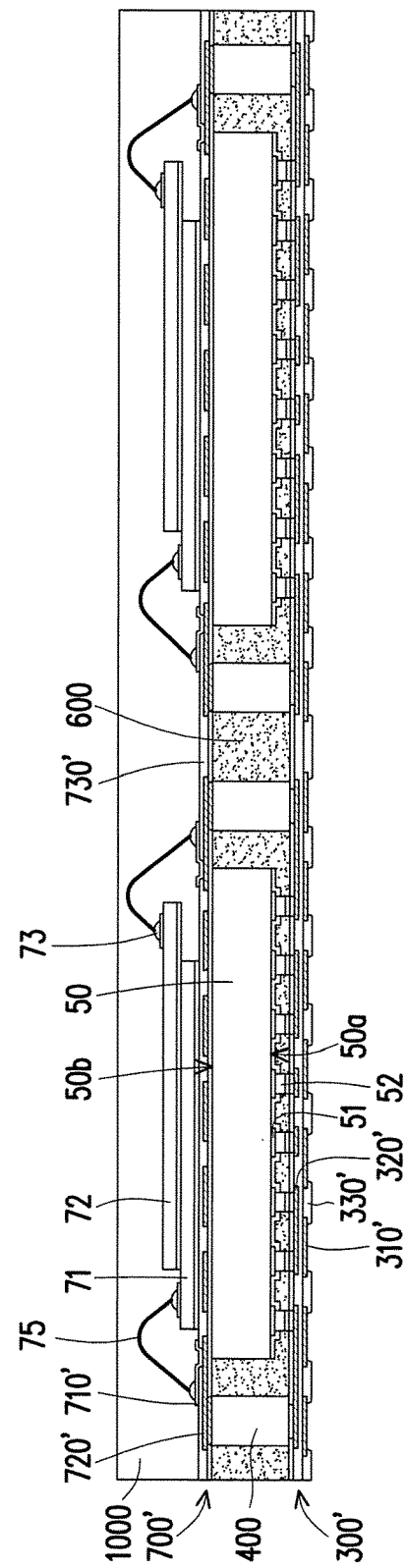

Referring to FIG. 2J, the insulation encapsulation 1000 may be utilized to encapsulate the die-stacked structure 70 on the surface of the second redistribution layer 700'. As the above-mentioned, the laterals sides of the insulation encapsulation 1000 may be aligned with the insulation encapsulation 600. That is, the die 50 and the die-stacked structure 70 may be disposed in a single package collectively. As such, there is no extra gap or substrates existed between the die-stacked structure 70 and the second redistribution layer 700'. The overall thickness of the package structure and the conductive path between the die-stacked structure 70 and the die 50 can be further reduced and curtailed.

Referring to 2K, a plurality of conductive balls 1100 may be formed on the ball pads 310' of the second redistribution layer 300' through, for example, a ball placement process and a reflow process. Referring to FIG. 2L, after placing the conductive balls 1100 on the ball pads 310', a singulation process is performed on the package structure 10 illustrated in FIG. 2K to render the individual package structure 10 as shown in FIG. 2L.

In light of the foregoing, the package structure may include a top redistribution layer, a lower redistribution layer and a die disposed therebetween. Moreover, a die-stacked structure may be disposed above the die and the top redistribution layer. A bottom side of the die-stacked structure may be in direct contact with the top redistribution layer, and a plurality of the conductive wires is connected therebetween. As such, there are no extra gaps or substrates disposed between the bottom side of the die-stacked structure and the top redistribution layer. Accordingly, the die-stacked structure may be electrically connected to the die through the conductive wires, the top redistribution layer, the bottom redistribution layer, and the conductive pillars disposed therebetween. Through the above-mentioned configurations, the package structure can be further simplified and miniaturized at least in its thickness and the conductive paths. The simplified package structure may also reduce the time and material consumptions in the manufacturing process, so as to reduce the overall manufacturing cost.

It will be apparent to those skilled in the art that various modifications and variations can be made to the structure of the present invention without departing from the scope or spirit of the invention. In view of the foregoing, it is intended that the present invention including modifications and variations of this invention falls within the scope of the following claims and their equivalents.

What is claimed is:

1. A package structure comprising:
   a first redistribution layer having a first surface and a second surface opposite to the first surface;
   a second redistribution layer disposed above the first surface;
   a die disposed between the first redistribution layer and the second redistribution layer and having an active surface and a rear surface opposite to the active surface, wherein the active surface is adhered to the first surface, and the die is electrically connected to the first redistribution layer;
   a plurality of conductive terminals disposed between the first redistribution layer and the active surface of the die;
   a plurality of bumps bonded between the active surface of the die and the conductive terminals;
   a plurality of pads disposed within the active surface of the die and the bumps disposed on the pads;
   a plurality of conductive pillars disposed and electrically connected between the first redistribution layer and the second redistribution layer, wherein each conductive pillar has one end formed on and in physical contact with the first redistribution layer and another end in physical contact with the second redistribution layer, the second redistribution layer being directly formed on the other end of the conductive pillar; and
   a die-stacked structure bonded on the second redistribution layer.

2. The package structure according to claim 1, further comprising a first insulation encapsulation disposed between the first redistribution layer and the second redistribution layer, wherein the first insulation encapsulation covers the die and the conductive pillars.

3. The package structure according to claim 2, further comprising a second insulation encapsulation disposed on and in contact with the second redistribution layer to encapsulate the die-stacked structure.

4. The package structure according to claim 3, wherein lateral sides of the first redistribution layer are aligned with lateral sides of the second redistribution layer.

5. The package structure according to claim 1, further comprising an adhesive layer disposed between the die and the die-stacked structure.

6. The package structure according to claim 1, wherein the die is electrically connected to the first redistribution layer through copper pillars by flip-chip bonding.

7. The package structure according to claim 1, wherein the die-stacked structure comprises a plurality of dies.

8. The package structure according to claim 1, wherein the die-stacked structure comprises:
   a first semiconductor die disposed on the second redistribution layer;
   a second semiconductor die disposed above the first semiconductor die; and
   a die attach film, disposed between the first semiconductor die and the second semiconductor die.

9. A manufacturing method of a package structure, comprising:
   providing a first carrier substrate;
   forming a first redistribution layer on the first carrier substrate, wherein the first redistribution layer has a first surface and a second surface opposite to the first surface, wherein the first surface faces the first carrier substrate;
   transferring the first redistribution layer from the first carrier substrate to the second carrier substrate, wherein the second carrier substrate is adhered to the second surface of the first redistribution layer;
   forming a plurality of conductive terminals on the first surface of the first redistribution layer;
   forming a plurality of conductive pillars on the first surface, wherein each conductive pillar has one end formed on and in physical contact with the first redistribution layer;
   disposing a plurality of dies on the first surface and among the conductive pillars, wherein each die has an active surface and a rear surface opposite to the active surface, a plurality of pads disposed within the active surface of the die, and a plurality of bumps formed on the active surface of the die and on the pads, the active surfaces of the dies face the first surface of the first redistribution layer, and the dies are electrically connected to the first redistribution layer by bonding the bumps to the conductive terminals;
   encapsulating the dies and the conductive pillars using a first insulation encapsulation; forming a second redistribution layer over the dies and the first insulation encapsulation and directly on another end of each conductive pillar, wherein the second redistribution layer is adhered to the rear surfaces of the dies and is in physical contact with the other end of each conductive pillar;
   separating the second earner substrate from the first redistribution layer; and
   bonding a die-stacked structure to the second redistribution layer.

10. The manufacturing method according to claim 9, further comprising thinning the first insulation encapsulation to expose the conductive pillars after the step of encapsulating the dies and the conductive pillars.

11. The manufacturing method according to claim 9, wherein the die-stacked structure is wire bonded to the second redistribution layer.

12. The manufacturing method according to claim 9, further comprising forming a plurality of ball pads on the first redistribution layer.

13. The manufacturing method according to claim 9, further comprising encapsulating the die-stacked structure on the second redistribution layer by a second insulation encapsulation.

* * * * *